(12) United States Patent
Smith

(10) Patent No.: US 10,609,769 B1
(45) Date of Patent: Mar. 31, 2020

(54) REMOVABLE TRANSPARENT ELECTRICALLY CONDUCTIVE THIN FILM

(71) Applicant: Charles R. Smith, Acton, CA (US)

(72) Inventor: Charles R. Smith, Acton, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 288 days.

(21) Appl. No.: 15/622,911

(22) Filed: Jun. 14, 2017

(51) Int. Cl.
| | |
|---|---|
| *H05B 3/84* | (2006.01) |
| *H05F 3/00* | (2006.01) |
| *H01B 1/08* | (2006.01) |
| *H01B 5/14* | (2006.01) |
| *B32B 7/12* | (2006.01) |
| *B32B 37/12* | (2006.01) |
| *H05B 3/12* | (2006.01) |
| *H05K 9/00* | (2006.01) |
| *B60J 1/02* | (2006.01) |

(52) U.S. Cl.
CPC ............... *H05B 3/84* (2013.01); *B32B 7/12* (2013.01); *B32B 37/12* (2013.01); *H01B 1/08* (2013.01); *H01B 5/14* (2013.01); *H05B 3/12* (2013.01); *H05F 3/00* (2013.01); *B32B 2307/202* (2013.01); *B32B 2307/412* (2013.01); *B32B 2605/00* (2013.01); *B60J 1/02* (2013.01); *H05B 2203/013* (2013.01); *H05B 2203/016* (2013.01); *H05B 2203/017* (2013.01); *H05K 9/0081* (2013.01)

(58) Field of Classification Search
CPC ... H05B 3/84; H05B 3/12; H01B 1/08; H01B 5/14; H05F 3/00; B32B 7/12; B32B 37/12; B32B 2307/202; B32B 2307/412
See application file for complete search history.

(56) References Cited

U.S. PATENT DOCUMENTS

| | | | | |
|---|---|---|---|---|
| 3,638,225 | A * | 1/1972 | Zawodniak | B60J 1/02 174/251 |
| 4,323,946 | A * | 4/1982 | Traux | H05F 3/00 244/1 A |
| 2008/0176018 | A1 * | 7/2008 | Enniss | B07C 5/3427 428/41.8 |
| 2014/0158300 | A1 * | 6/2014 | Hayata | C09J 133/08 156/345.3 |
| 2015/0210375 | A1 * | 7/2015 | Harrison | B64C 1/1492 244/1 A |

* cited by examiner

*Primary Examiner* — Daniel McNally
(74) *Attorney, Agent, or Firm* — Tarolli, Sundheim, Covell & Tummino LLP

(57) ABSTRACT

One example includes a system that is comprised of a transparent protective panel, a transparent electrically conductive thin film, a transparent pane, and an adhesive. The transparent electrically conductive thin film is fixed to the transparent protective panel, the transparent protective panel and the transparent electrically conductive film together forming a composite transparent panel. The adhesive adhesively couples the composite transparent panel to the transparent pane, the adhesive failing adhesively at an interface between the adhesive and the transparent pane.

20 Claims, 5 Drawing Sheets

US 10,609,769 B1

REMOVABLE TRANSPARENT ELECTRICALLY CONDUCTIVE THIN FILM

TECHNICAL FIELD

This disclosure relates to a transparent electrically conductive thin film, and more specifically to a removable transparent electrically conductive thin film.

BACKGROUND

Transparent electrically conductive thin films are used on a variety of devices that include a transparent pane, such as flat-panel displays, smart windows, polymer-based electronics, thin film photovoltaics, and windows (e.g., windshields). Such transparent electrically conductive thin films can be constructed from a variety of materials. One such material includes Indium tin oxide (ITO) that is a ternary composition of varying proportions of indium, tin and oxygen. ITO is a transparent conducting oxide that is electrically conductive and optically transparent. ITO is deposited as a thin film on surfaces by physical vapor deposition, electron beam evaporation, sputter deposition techniques, or any other technique that provides for deposition that maintains the electrical conductive and optical transparent properties. Other example materials of transparent electrically conductive thin films that can be used as an alternative to ITO include aluminum-doped zinc oxide (AZO), indium-doped cadmium oxide, carbon nanotube conductive coatings, films of grapheme, and amorphous transparent conducting oxides (e.g., amorphous indium-zinc-oxide).

SUMMARY

One example includes a system that is comprised of a transparent protective panel, a transparent electrically conductive thin film, a transparent pane, and an adhesive. The transparent electrically conductive thin film is fixed to the transparent protective panel, the transparent protective panel and the transparent electrically conductive film together forming a composite transparent panel. The adhesive adhesively couples the composite transparent panel to the transparent pane, the adhesive failing adhesively at an interface between the adhesive and the transparent pane.

Another example includes a method that includes fixing a transparent electrically conductive thin film to a transparent protective panel, the transparent protective panel and the transparent electrically conductive film together forming a composite transparent panel. The method further includes adhesively coupling the composite transparent panel to a transparent pane via an adhesive, the adhesive failing adhesively at an interface between the adhesive and the transparent pane.

Another example includes another system that is comprised of a transparent erosion shield, a transparent electrically conductive thin film, a windshield of a vehicle, an adhesive, a metallic shim. The transparent electrically conductive thin film is fixed to the transparent erosion shield, the transparent erosion shield and the transparent electrically conductive film together forming a composite transparent panel. The adhesive adhesively couples the composite transparent panel to the windshield and fails adhesively at an interface between the adhesive and the windshield. The metallic shim is fixed to the windshield and electrically couples the transparent electrically conductive thin film with a frame structure. The seal electrically couples the metallic shim to the frame structure.

DETAILED DESCRIPTION

The disclosure is related to a transparent pane that utilizes a removable transparent electrically conductive thin film. One example includes a system that is comprised of a transparent protective panel, a transparent electrically conductive thin film, a transparent pane, and an adhesive. The transparent electrically conductive thin film is fixed to the transparent protective panel, the transparent protective panel and the transparent electrically conductive film together forming a composite transparent panel. The adhesive adhesively couples the composite transparent panel to the transparent pane, the adhesive failing adhesively at an interface between the adhesive and the transparent pane.

Such an example system provides for simplified replacement of the protective panel. Other systems utilize a transparent electrically conductive thin film that is fixed to the transparent pane. When a technician removes and replaces the transparent protective panel, the transparent electrically conductive thin film can become damaged. In some instances, particularly if the transparent protective panel has been repeatedly removed and replaced, the transparent electrically conductive thin film may become so severely damaged that it requires replacement. Since these other systems utilize a transparent electrically conductive thin film that is fixed to the transparent pane, removal and replacement is a time consuming and difficult process. The example system overcomes such a deficiency by fixing the transparent electrically conductive thin film to the transparent protective panel instead. By utilizing an adhesive to adhesively couple the transparent electrically conductive thin film to the transparent pane, with the adhesive failing adhesively at an interface between the adhesive and the transparent pane, the transparent electrically conductive thin film and the transparent protective panel can be easily removed and replaced.

Figure 1:
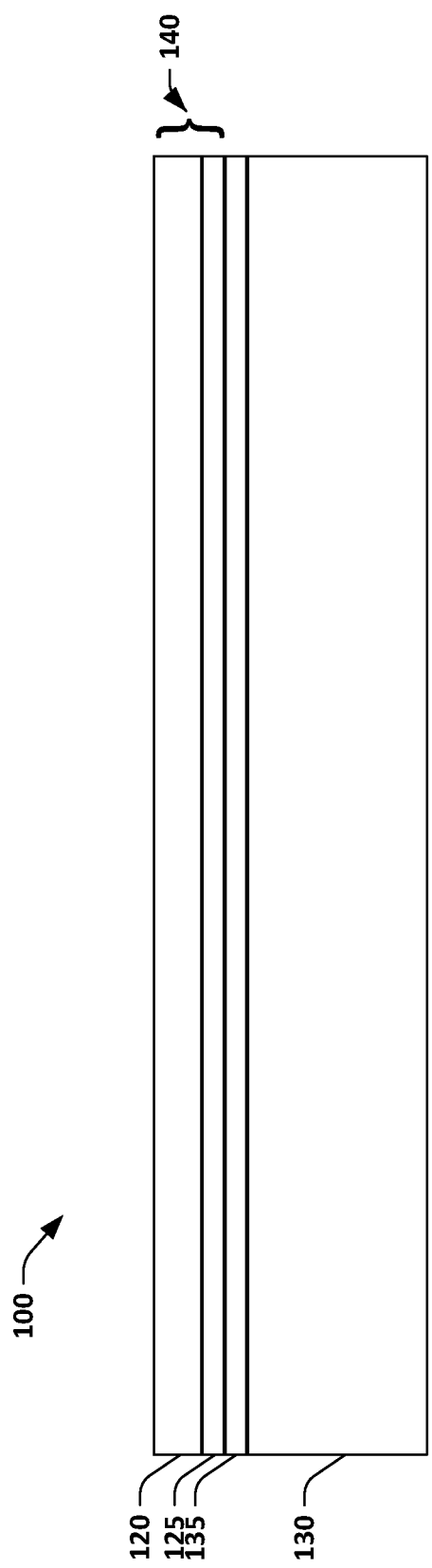
FIG. 1 illustrates an example system that includes a transparent electrically conductive thin film.

FIG. 1 illustrates an example system 100 that includes a transparent electrically conductive thin film 125. The system 100 includes a transparent pane 130 such as used with flat-panel displays, smart windows, polymer-based electronics, thin film photovoltaics, and windows (e.g., windshields). In some applications transparent pane 130 is approximately flat. Alternatively, for other applications the transparent pane 130 is curved. The transparent pane 130 can be constructed of a variety of materials that include glass (e.g., tempered glass), laminated glass (e.g., including an interlayer, typically of polyvinyl butyral (PVB) or ethylene-vinyl acetate (EVA), between two or more layers of glass), polycarbonate, Ethylene Tetra Fluoro Ethylene, or any other transparent material. The transparent pane 130 can be made in a variety of shapes dependent upon application. For example, the transparent pane 130 can be square, rectangular, oval, round, trapezoidal, or any other shape that is suited for a particular application.

The system 100 further includes a transparent protective panel 120. The transparent protective panel 120 is approximately same length and width as the transparent pane 130. Alternatively, the transparent protective panel 120 is either shorter or longer in length and/or width than the transparent pane 130. In an example, the transparent protective panel 120 is a transparent polymeric erosion shield that is used to protect the transparent pane 130. For example, for applications in which the transparent pane 130 is a windshield of an aircraft, transparent protective panel 120 protects the windshield from debris (e.g., sand) that may etch the transparent protective panel 120 and lower the transparency of the windshield over time. Thus, instead of such debris etching the transparent pane 130, such debris will instead etch the transparent protective panel 120.

The system 100 further includes a transparent electrically conductive thin film 125 (e.g., Indium tin oxide (ITO), aluminum-doped zinc oxide (AZO), indium-doped cadmium oxide, carbon nanotube conductive coatings, films of grapheme, and amorphous transparent conducting oxides (e.g., amorphous indium-zinc-oxide), or any other transparent conductive thin film) that is fixed to the transparent protective panel 120. In an example, the transparent protective panel 120 is approximately 0.005 inches thick. The transparent electrically conductive thin film 125 can be fixed to the transparent protective panel 120 via physical vapor deposition (PVD), such as sputtering. The transparent electrically conductive thin film 125 and the transparent protective panel 120 together form a composite transparent panel 140. An alternative process of fixing the transparent electrically conductive thin film 125 to the transparent protective panel 120 includes use of a particle-based technique, such as a tape casting process. Another alternative process of fixing the transparent electrically conductive thin film 125 to the transparent protective panel 120 is a colloidal solution that converts monomers into a colloidal solution of either discrete particles or network polymers. The transparent electrically conductive thin film 125 is fixed onto an area that coincides with a length and width of the transparent protective panel 120. Alternatively, the transparent electrically conductive thin film 125 is fixed onto an area that is smaller than the transparent pane 130. Irrespective of the process used to fix the transparent electrically conductive thin film 125 to the transparent protective panel 120, removal of the transparent protective panel 120 from the system will also result in removal of the transparent electrically conductive thin film 125.

The system 100 further includes an adhesive 135 that is disposed between the transparent electrically conductive thin film 125 and the transparent protective panel 120. In an example, the adhesive 135 is approximately evenly distributed across a length and width of the transparent electrically conductive thin film 125. The transparent electrically conductive thin film 125/transparent protective panel 120 can then be applied as a "peal-and-stick" overlying the transparent pane 130. Alternatively, the adhesive 135 can be sprayed on to the transparent electrically conductive thin film 125 to allow the transparent electrically conductive thin film 125/transparent protective panel 120 to be applied to the transparent pane 130. The adhesive 135 adhesively couples the composite transparent panel 140, e.g., the transparent electrically conductive thin film 125, to the transparent pane 130. The adhesive 135 adhesively fails at an interface between the adhesive 135 and the transparent pane 130. Although the composite transparent panel 140 is illustrated as being coupled to the transparent pane 130, in another example the composite transparent panel 140 is coupled to one or more intermediate transparent materials (not shown), such as an anti-reflective transparent film, with the one or more intermediate transparent materials being adhesively coupled or fixed to the transparent pane 130.

Thus, the transparent electrically conductive thin film 125 and the transparent protective panel 120 can be the removed together when a technician needs to replace the transparent protective panel 120. In other systems the transparent electrically conductive thin film 125 is fixed to the transparent pane 130, with removal of the transparent protective panel 120 potentially damaging the transparent electrically conductive thin film 125. In an example, the adhesive is a fluorosilicone adhesive that is formulated to provide a bond between the transparent electrically conductive thin film 125 and the transparent protective panel 120 that is strong enough to prevent their separation while the transparent protective panel 120 is providing protection for the transparent pane 130, but allows for easy removal (e.g., pull off with a fingertip without requiring tools) of the transparent electrically conductive thin film 125/transparent protective panel 120 without damaging the transparent pane 130. Removing the transparent electrically conductive thin film 125/transparent protective panel 120 together as a single unit allows subsequent application of a new transparent electrically conductive thin film 125/transparent protective panel 120 as a single unit that provides the same functionality as an original equipment part.

Figure 2:
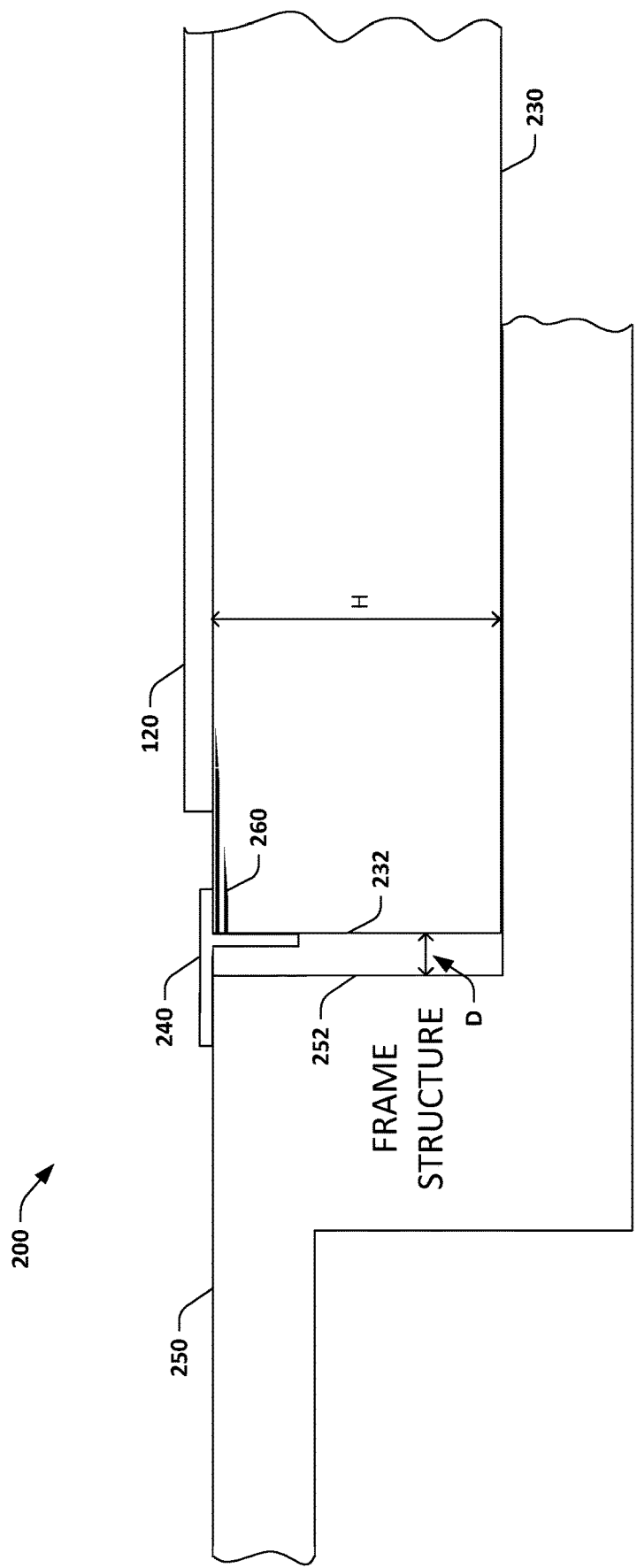
FIG. 2 illustrates an example application of the system illustrated in FIG. 1 to a vehicle.

FIG. 2 illustrates an example application of the system 100 to a vehicle (e.g., an airplane, a helicopter, an automobile, a motorcycle, or any other vehicle). In this example, the system 200 includes the components of the system 100 and further includes a frame structure 250. In this example, the transparent plane 130 is a windshield 230 of the vehicle. Although shown from one side of the windshield 230, the frame structure 250 surrounds the windshield 230, for example, four sides thereof. In an example, an outside edge 232 of the windshield 230 is spaced a distance D from a vertically illustrated portion 252 of the frame structure 250, the spacing providing a space in which the frame structure 250 flexes without contacting the windshield 230. This spacing is dependent upon the degree of flexure of the frame structure 250, with frame structures 250 having greater flexure utilizing a larger distance D, and vise versa. In an example, a height H of the windshield 230 is approximately a same height as the vertically illustrated portion 252 of the frame structure 250. In other examples, the height H of the windshield 230 is shorter or taller than the vertically illustrated portion 252 of the frame structure 250.

The system 200 further includes a seal 240 that bridges the distance D between the outside edge 232 of the windshield 230 and the vertically illustrated portion 252 of the frame structure 250. In an example, the seal 240 is metallic, for example, stainless steel, a ferromagnetic material coated to prevent corrosion, and/or any other electrically conductive material. In other examples, the seal 240 is constructed of a non-electrically conductive material and coated (e.g., electroplated, powder-coated, painted, etc.) with an electrically conductive material that electrically couples the transparent electrically conductive thin film 125 with the frame structure 250.

In an example, the seal 240 is T shaped with an illustrated top of the T having unequal lengths, a left side of the T being longer than a right side of the T. In other examples, the T is symmetrical left to right, and in yet other examples the left side of the T is shorter than the right side of the T. Irrespective of the proportions of the left/rights sides of the T, the right side of the seal 240 is fixed (e.g., screws, adhesive, or any other fixing scheme) to prevent the seal 240 from being easily removed from the windshield 230. The illustrated vertical portion of the seal 240 is in contact with the outside edge 232 of the windshield 230. In an example, the seal 240 is held against the frame structure 250 via a spring force that maintains electrically coupling between the seal and the frame structure 250.

The system 200 further includes a shim 260. The transparent electrically conductive thin film 125 is capacitively coupled to the shim 260, with the adhesive 135 therebetween. The shim 260 is disposed in an upper outside facing corner of the windshield 230 proximate to the frame structure 250. In an example, the shim 260 is tapered, tapering from a narrower portion proximate to where the shim 260 is coupled via the adhesive 135 to the transparent electrically conductive thin film 125 to a wider portion proximate to where the shim 260 is electrically coupled to the illustrated vertical portion of the seal 240. In an example, the shim 260 tapers from approximately 0.030 inches at its maximum thickness and is approximately 0.50 inches in length, tapering in a straight line therebetween. In other examples, the shim 260 is other shapes including square, rectangular, trapezoidal, or any other shape that provides for electrical contact between the transparent electrically conductive thin film 125, the shim 260, and the seal 240. The shim 260 is electrically coupled to the seal 240 and provides an electrically conductive path between the transparent electrically conductive thin film 125 and the seal 240.

Figure 3:
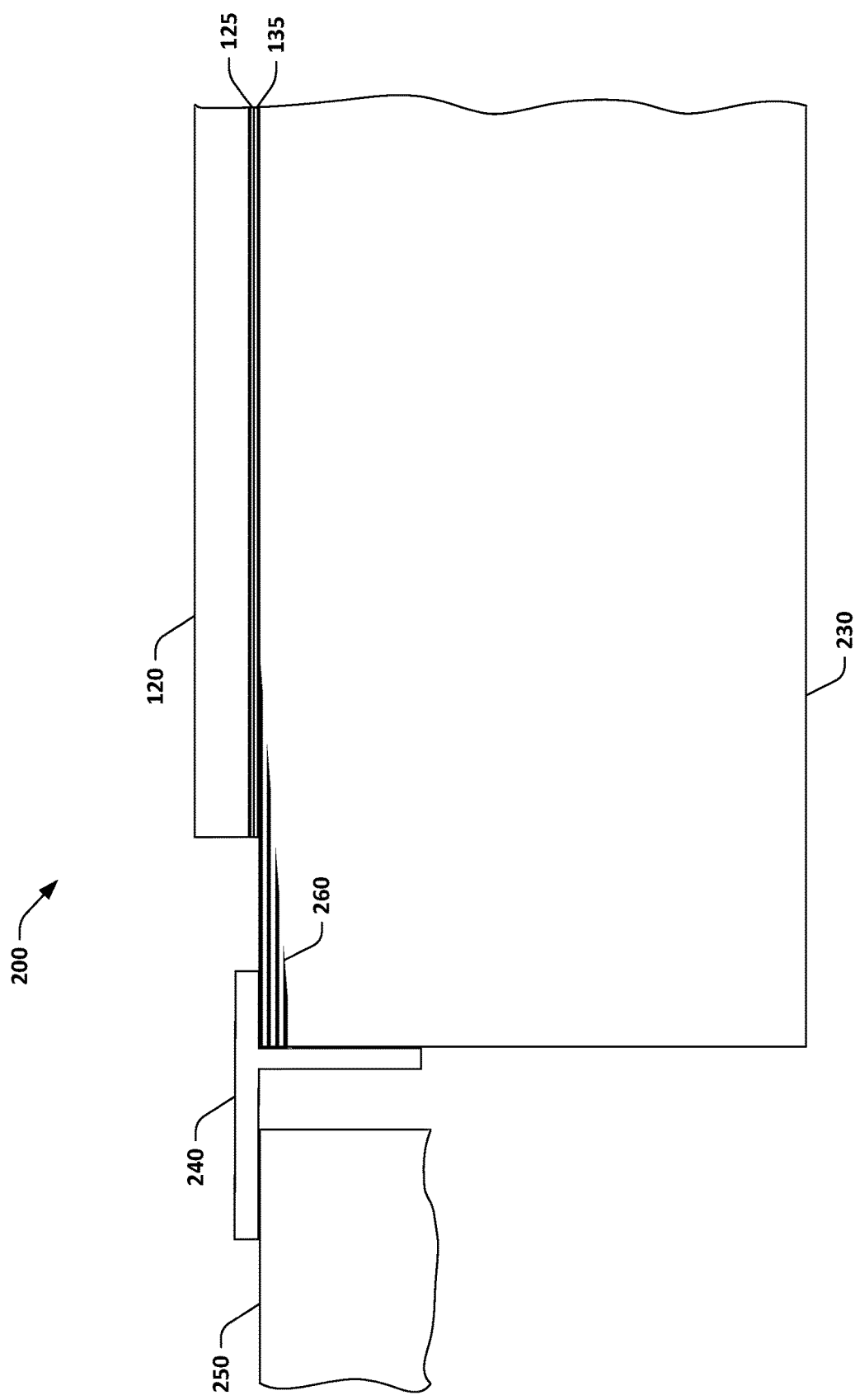
FIG. 3 illustrates a detailed view of the example application of the system illustrated in FIG. 1 to the vehicle illustrated in FIG. 2.

FIG. 3 illustrates a detailed view of the example application of the system 100 to the vehicle illustrated in FIG. 2. The adhesive 135 adhesively couples the transparent electrically conductive thin film 125 to the shim 260 fixed to the windshield 230. The transparent electrically conductive thin film 125 can serve a number of functions. For example, the transparent electrically conductive thin film 125 is an electrically resistive heating element that generates heat in response to application of a voltage to the transparent electrically conductive thin film 125. As another example, the transparent electrically conductive thin film 125 dissipates electrostatic charges from the system 200. In yet another example, the transparent electrically conductive thin film 125 provides for electromagnetic interference (EMI) protection for electronics within the vehicle in the event of a lightning strike proximate to the vehicle.

Figure 4:
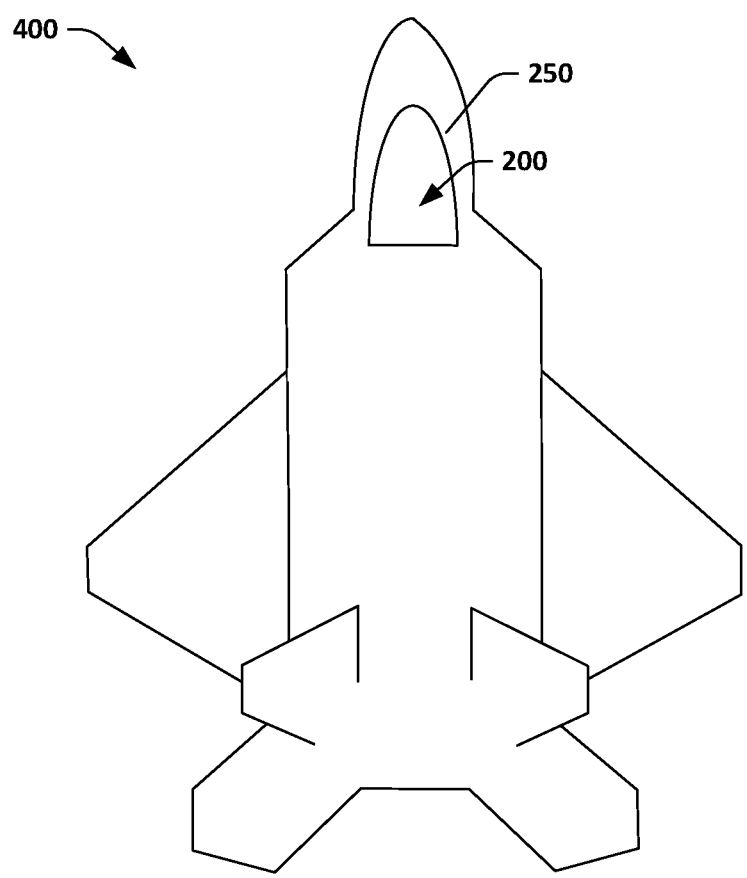
FIG. 4 illustrates an example aircraft that utilizes the system illustrated in FIGS. 2 and 3.

FIG. 4 illustrates an example aircraft 400 that utilizes the system 200 illustrated in FIGS. 2 and 3. In this example, the aircraft 400 utilizes the system 200, with the aircraft 400 body forming the frame structure 250.

Figure 5:
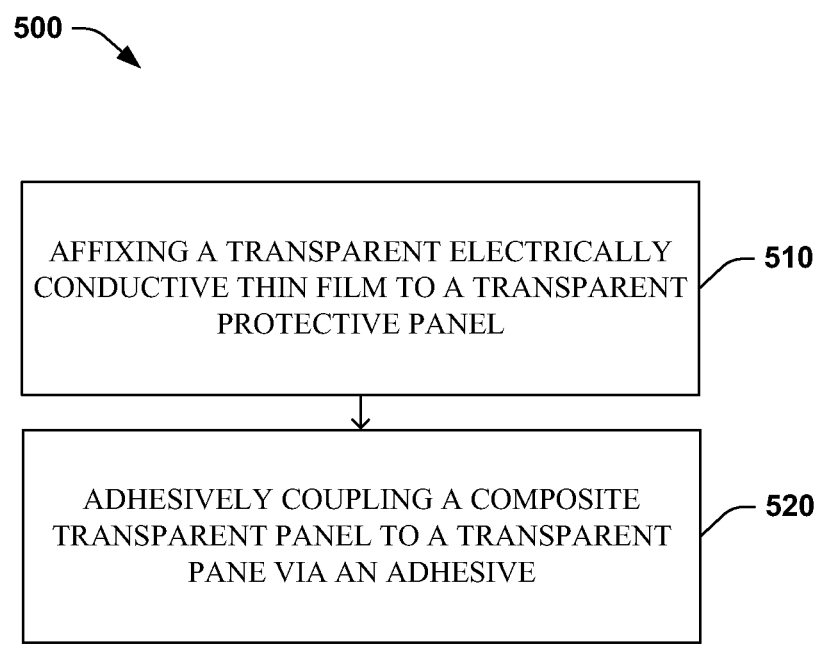
FIG. 5 illustrates a method of adhesively coupling a composite transparent panel to a transparent pane.

In view of the foregoing structural and functional features described above, a method in accordance with various aspects of the present disclosure will be better appreciated with reference to FIG. 5. While, for purposes of simplicity of explanation, the method of FIG. 5 is shown and described as executing serially, it is to be understood and appreciated that the present disclosure is not limited by the illustrated order, as some aspects may, in accordance with the present disclosure, occur in different orders and/or concurrently with other aspects from that shown and described herein. Moreover, not all illustrated features may be required to implement a method in accordance with an aspect of the present disclosure.

FIG. 5 illustrates a method 500 of adhesively coupling the composite transparent panel 140 to the transparent pane 130.

At 510, the method 500 fixes the transparent electrically conductive thin film 125 to the transparent protective panel 120, the transparent protective panel 120 and the transparent electrically conductive thin film 125 together forming the composite transparent panel 140. In an example, the transparent pane 130 is a windshield 230.

The method 500 can fix the composite transparent panel 140 to the transparent protective panel 120 via physical vapor deposition (PVD) (e.g., sputtering), a particle-based technique (e.g., a tape casting process), a colloidal solution that converts monomers into a colloidal solution of either discrete particles or network polymers, or any other scheme that fixes the transparent electrically conductive thin film 125 to the transparent protective panel 120 such that they cannot be easily separated without damaging the transparent electrically conductive thin film 125 and/or the transparent protective panel 120. Other methods fix the transparent electrically conductive thin film 125 to the transparent pane 130 which results in potential damage to the transparent electrically conductive thin film 125 in the event that the transparent protective panel 120 is removed by a technician. The method 500 overcomes such a deficiency.

At 520, the method 500 adhesively couples the composite transparent panel 140 to the transparent pane 130 via the adhesive 135, the adhesive 135 failing adhesively at an interface between the adhesive 135 and the transparent pane 130. The method 500 can utilize a fluorosilicone adhesive that is formulated to provide a bond between the transparent electrically conductive thin film 125 and the transparent protective panel 120 that is strong enough to prevent their separation while the transparent protective panel 120 is providing protection for the transparent pane 130, but allows for easy removal of the transparent electrically conductive thin film 125/transparent protective panel 120 without damaging the transparent pane 130. The method 500 can include application of the adhesive 135 to the transparent electrically conductive thin film 125. Alternatively, the method 500 can include application of the adhesive 135 to the transparent pane 130.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A system, comprising:
   a composite transparent panel comprised of only two layers including:
      a transparent protective panel; and
      a transparent electrically conductive thin film fixed to the transparent protective panel;
   a transparent pane; and
   an adhesive to adhesively couple the composite transparent panel to the transparent pane, the adhesive failing adhesively at an interface between the adhesive and the transparent pane to facilitate easy removal of the composite transparent panel without damaging the transparent electrically conductive film.

2. The system of claim 1, further comprising a metallic shim that is fixed to the transparent pane and electrically couples the transparent electrically conductive thin film with a frame structure.

3. The system of claim 2, further comprising a T shaped seal to electrically couple the metallic shim to the frame structure.

4. The system of claim 3, wherein the metallic shim is a tapered metallic shim that tapers from a narrower portion proximate to where the tapered metallic shim is coupled to the transparent electrically conductive thin film to a wider portion proximate to where the tapered metallic shim is electrically coupled to the seal.

5. The system of claim 2, wherein the transparent electrically conductive thin film is capacitively coupled to the metallic shim.

6. The system of claim 1, wherein the transparent protective panel is a transparent polymeric panel approximately equal in length with the transparent electrically conductive thin film and the transparent pane.

7. The system of claim 1, wherein the transparent electrically conductive thin film is an electrically resistive heating element that generates heat in response to application of a voltage to the transparent electrically conductive thin film.

8. The system of claim 1, wherein the transparent electrically conductive thin film is an Iridium Tin Oxide (ITO) coating.

9. The system of claim 1, wherein the transparent electrically conductive thin film dissipates electrostatic charges from the system.

10. The system of claim 1, wherein the transparent pane is a windshield laminate.

11. A method, comprising:
fixing a transparent electrically conductive thin film to a transparent protective panel, the transparent protective panel and the transparent electrically conductive thin film together being the only two layers that form a composite transparent panel; and
adhesively coupling the composite transparent panel to a transparent pane via an adhesive, the adhesive failing adhesively at an interface between the adhesive and the transparent pane, which facilitates easy removal of the composite transparent panel without damaging the transparent electrically conductive film.

12. The method of claim 11, further comprising fixing a metallic shim to the transparent pane to electrically couple the transparent electrically conductive thin film with a frame structure.

13. The method of claim 12, further comprising disposing a seal between the metallic shim and the frame structure, the seal electrically coupling the metallic shim and the frame structure.

14. The method of claim 11, generating heat with the transparent electrically conductive thin film in response to application of a voltage to the transparent electrically conductive thin film.

15. The method of claim 11, wherein the transparent electrically conductive thin film is an Iridium Tin Oxide (ITO) coating.

16. A system, comprising:
a composite transparent panel comprised of only two layers including:
a transparent erosion shield; and
a transparent electrically conductive thin film fixed to the transparent erosion shield;
a windshield of a vehicle;
an adhesive to adhesively couple the composite transparent panel to the windshield, the adhesive failing adhesively at an interface between the adhesive and the windshield to facilitate easy removal of the composite transparent panel without damaging the transparent electrically conductive film;
a metallic shim that is fixed to the windshield and electrically couples the transparent electrically conductive thin film with a frame structure; and
a seal to electrically couple the metallic shim to the frame structure.

17. The system of claim 16, wherein the transparent erosion shield is a transparent polymeric panel approximately equal in length with the transparent electrically conductive thin film and the windshield.

18. The system of claim 16, wherein the transparent electrically conductive thin film is an electrically resistive heating element that generates heat in response to application of a voltage to the transparent electrically conductive thin film.

19. The system of claim 16, wherein the transparent electrically conductive thin film is capacitively coupled to the metallic shim.

20. The system of claim 16, wherein the transparent electrically conductive thin film is an Iridium Tin Oxide (ITO) coating.

* * * * *